United States Patent [19]
Ott

[11] Patent Number: 5,122,227
[45] Date of Patent: Jun. 16, 1992

[54] METHOD OF MAKING A MONOLITHIC INTEGRATED MAGNETIC CIRCUIT

[75] Inventor: Granville E. Ott, Richardson, Tex.

[73] Assignee: Texas Instruments Incorporated, Dallas, Tex.

[21] Appl. No.: 426,519

[22] Filed: Oct. 25, 1989

Related U.S. Application Data

[62] Division of Ser. No. 925,357, Oct. 31, 1986, abandoned.

[51] Int. Cl.[5] .......................... B44C 1/22; C23F 1/02
[52] U.S. Cl. ............................... 156/659.1; 156/644; 156/653; 156/656; 156/657
[58] Field of Search ............ 156/653, 656, 657, 659.1, 156/644; 29/604, 609; 365/55, 58, 59, 61, 133, 173; 427/128, 129, 130, 131, 132

[56] References Cited

U.S. PATENT DOCUMENTS

| | | | |
|---|---|---|---|
| 3,222,656 | 12/1965 | Olsson | 365/58 |
| 3,484,756 | 12/1969 | Voegeli | 365/173 |
| 3,520,052 | 7/1970 | Hoffmann | 29/604 |
| 3,786,445 | 1/1974 | Ho et al. | 365/8 |
| 4,149,302 | 4/1979 | Cook | 29/604 |
| 4,229,805 | 10/1980 | Breed | 365/2 |

*Primary Examiner*—William A. Powell
*Attorney, Agent, or Firm*—James C. Kesterson; B. Peter Barndt; Richard L. Donaldson

[57] ABSTRACT

Disclosed is a monolithic magnetic integrated circuit. A magnetic material (22) is formed on a semiconductor substrate (10) in multiple layers to form a closed circuit. The closed circuit magnetic material (42) is formed around a deposited conductor (32) which is insulated from the magnetic circuit by silicon dioxide (34).

10 Claims, 2 Drawing Sheets

METHOD OF MAKING A MONOLITHIC INTEGRATED MAGNETIC CIRCUIT

This application is a. Division of application Ser. No.06/925,357, filed Oct. 31. 1986, Abandmed.

TECHNICAL FIELD OF THE INVENTION

The present invention relates in general to magnetic materials, and more particularly relates to the integration of magnetic properties into semiconductor integrated ciruits.

BACKGROUND OF THE INVENTION

Inductance is an electrical characteristic which is necessary to the operation of many circuits. For example, inductance and capacitance provide the necessary nonlinear characteristics for oscillators. When used in connection with transformers, inductance permits electrical signals to be coupled from one circuit to another without a physical connection therebetween. Transformers find a wide variety of applications including impedance matching, step-up or step-down, and DC voltage isolation.

Discrete inductors and transformers are made to satisfy numerous electrical parameters, such as power rating. breakdown voltage. inductance, resistance, size, weight, etc. Magnetic circuits of this type are well known in the art, and have been highly developed to satisfy almost any application. Thus, when a magnetic device of desired parameters is required. such a device may be readily obtainable. Generally, the discrete magnetic devices are assembled on circuit boards, or other similar electrical apparatus, and connected by wires to associated electrical devices. Hybrid circuits are also well known in the art, and include integrated circuits formed in conjunction with discrete electrical components.

In an effort to more fully utilize magnetic materials, magnetic films have been employed to construct high density memories. In this type of application. the X and Y conductor arrays are sandwiched between a planar nonlinear magnetic film and a planar linear magnetic material. The magnetic material proximate the intersection of the conductors defines the memory element which can be switched to a magnetized or nonmagnetized state during memory write operations. The conductors can also be accessed during read operations to detemine the magnetized state of the memory location. This type of memory is of the nonvolatile type, but was expensive to fabricate, could not be easily manufactured in large arrays and was not well suited for miniaturization. As a result, such types of memories have been superseded by semiconductor counterparts.

Another application for magnetic circuits includes inductive logic circuits. With this type of logic family, inductance is a required electrical characteristic in order to provide the conventional AND/OR logic functions. Because of the past inability to to readily fabricate inductive characteristics into integrated circuits, such logic family has fallen from use, and has been superseded by the bipolar and MOSFET transistor logic families.

From the foregoing, it can be seen that a need exists for a method of fabricating magnetic circuits with silicon integrated circuits to form monolithic circuits. An associated need exists for fabricating monolithic integrated magetic circuits using conventional silicon semiconductor processes.

SUMMARY OF THE INVENTION

In accordance with the present invention. the disclosed monolithic magnetic circuit and method of fabrication thereof reduces or substantially eliminates the disadvantages and the shortcomings associated with the prior art devices. According to the monolithic integrated magnetic circuit of the invention, magnetic circuits can be formed on a semiconductor substrate before, during or after the fabrication of associated bipolar and or MOSFET devices.

The integrated magnetic circuit is formed by depositing an adhesive release layer of material on a semiconductor substrate. The adhesive release is patterned to define areas for locating a magetic material. A liquid magnetic material, such as sol-gel, is spun over the patterned adhesive release to a depth commensurate with the desired inductance. The substrate is heated to cure the magnetic material and to solidify it into a sheet. An adhesive-backed planar tool is then pressed against a solidified magnetic layer, and removed therefrom. The solidified magnetic material overlying the adhesive release areas in thus removed from the substrate, while leaving the patterned substrate areas covered with the magnetic material. The forgoing "lift-off" process is well known in the semiconductor industry.

A silicon dioxide (hereinafter silicon oxide) or silicon nitride may then be deposited over the surface of the wafer to form an insulating layer on the magnetic material. Standard first and second metallization patterns may be formed over the insulated magnetic material to provide conductors which are to be influenced by the magnetic material. The first and second metallization patterns are typically insulated according to conventional semiconductor fabrication insulating techniques.

The wafer is masked and patterned with a photoresist to define openings to desired areas of the underlying magnetic material. Additional liquid magnetic material is then spun or sprayed on the surface of the wafer to fill the patterned holes. Additional liquid magnetic material may then be spread over the surface of the wafer, and cured. As with the first magnetic material layer, the lift-off process can be used on the second layer to pattern it to define predetermined areas of material deposit. The second magnetic material layer can also be patterned using known photoresist techniques.

With this technique of connecting the top layer of magnetic material to the bottom layer at desired areas, the magnetic material can be formed to encircle desired metallization conductors, much like a ferrite bead on an electrical wire. Moreover, metallization patterns can be formed which encircle the magnetic material, thereby increasing the inductance in the circuit. Monolithic integrated circuit transformers are also achievable by forming a pair of closely spaced conductors magnetically coupled together with a core material so that magnetic coupling will exist therebetween.

BRIEF DESCRIPTION OF THE DRAWINGS

Further features and advantages will become more apparent from the following and more particular description of the preferred embodiment of the invention, as illustrated in the accompanying drawings in which like reference characters generally refer to the same parts throughout the same views, and in which.

DETAILED DESCRIPTION OF THE INVENTION

The principles and concepts of the invention are first described below in terms of the fabrication of a ferrite-type of magnetic circuit formed around a conductor. As will be apparent from the description of the invention, may other applications and variations of the structure and method of fabrication thereof are contemplated. The invention makes possible a "closed" magnetic circuit through which a conductor can be formed, as distinguished from and adjacent or "open" type of circuit characteristic of the well-known memory circuits referred to above.

Figure 1:
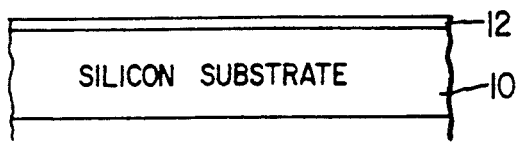
FIGS. 1-8 are cross-sectional view illustrating the monolithic magnetic ciruit during various fabrication steps thereof.
Figure 2:
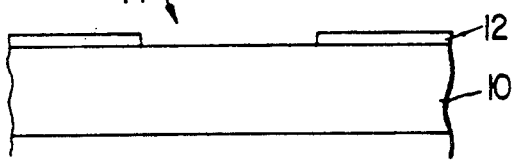

The monolithic integrated magnetic circuits of the invention can be fabricated generally by the same processes and techniques commonly utilized in the silicon fabrication technology. To that end a silicon substrate of suitable crystal orientation, conductivity and impurity dopant is selected to accommodate the type of transistor circuits also desired to be fabricated. FIG. 1 illustrates a silicon substrate 10 which provides a basis on which the magnetic circuit can be fabricated. Gallium arsenide, germanium, sapphire and other materials typically used in semiconductor fabrication may also be used as a base. Formed on the substrate 10 is an adhesive relase layer 12 which is typically used in conventional lift-off processes. The adhesive release 12 is patterned, as shown in FIG. 2, to define an area 14. A top view of FIG. 2 would show that the area 14 is generally rectangular in shape.

Figure 3:
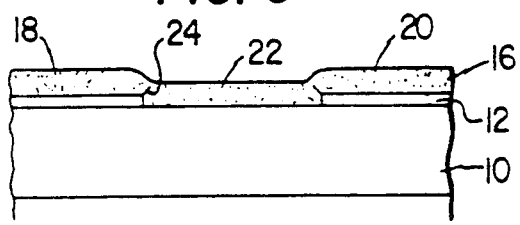

A layer of liquid magnetic material 16 is next spun over the surface of the wafer, covering the patterned area and the adhesive release layer 12 (FIG. 3). The magnetic material 16 may constitute finely powered magnetic metal or ferrite material suspended in a solvent to form a colloidal gel. The solvent is evaporated to solidify the magnetic material. Depending on the particular applications, the magnetic material may include magnetic metal alloys, such as nickel alloy, or ferrite and ceramic materials. The materials can be pulverized into micron size particles, preferably smaller than ten percent of the size of a feature or hole to be filled. A liquid viscous magnetic material having these characteristics is known in the art as sol-gel.

The liquid magnetic material is spun, or otherwise deposited on the substrate to a depth corresponding to a desired magnetic field property. For large magnetic properties, thicker layers can be deposited on the desired areas. The substrate is then heated to a modest temperature, such as 400°-500° centigrade, to drive the solvent from the magnetic material. The heating transforms or cures the layer 16 to a solid layer. Because of the colloidal mixture, the solid magnetic material is porous and thus it can be easily fractured.

An adhesive-backed planar tool (not shown) is then pressed onto the substrate, and lifted therefrom. As a result, the solidified magnetic material overlying the adhesive release layer 12 is easily lifted and removed from the substrate. As noted in FIG. 3, the solidified magnetic material areas 18 and 20 are separated from the area 22 along fracture lines, such as 24. The magnetic material area 22 adheres to the underlying substrate 10, and is thus not lifted from the substrate 10. The adhesive release 12 is then washed from the substrate by a suitable solution.

Figure 4:
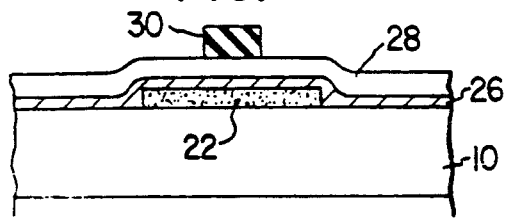

As illustrated in FIG. 4, an electrical insulating layer 26 is deposited over the surface of the wafer in the conformal manner as shown. Electrical isolating material suitable for use, and compatible with silicon processing techniques, comprises silicon oxide and silicon nitride. Other insulators may be used with equal effectiveness. A layer of metal 28 is deposited, such as by a sputtering process, on the isulating layer 26. A photoresist layer 30 is spead over layer of metal 28, and patterned to define first level metal conductors over the surface of the substrate. Generally, metallization processing of a semiconductor circuit is conducted after the active transistor circuits have been formed. The substrate is next subjected to an etch process, in which the exposed metal 28 is removed, leaving for areas underlying the patterned photoresist 30 intact. The foregoing describes the formation of conductors using a condutive metal. It should be understood that doped polycrystalline silicon can be used for conductors as well.

Figure 5:
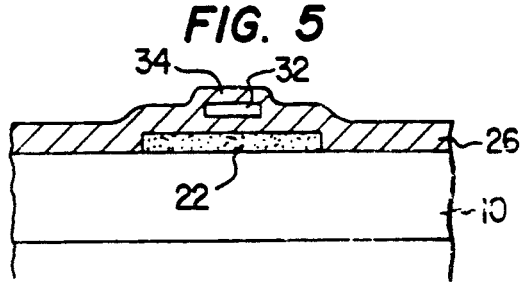

FIG. 5 illustrates the metal conductor 32 which is formed after the photoresist has been removed. In the example, a closed magnetic circuit will be formed around the conductor 32. An additional layer of insulating material 34 is deposited oover the exposed portions of metal conductor 32 and insulating layer 26, thereby insulating the metal conductor 32. When using silicon oxide as an insulator, layer 34 becomes homogeneous with layer 26.

Figure 6:
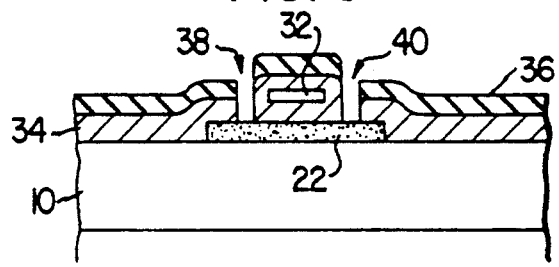

A photoresist 36 is again spread over the surface of the substrate and patterned to define openings 38 and 40 on opposing sides of the metal conductor 32. This step is illustrated in FIG. 6. The electrical insulator 34 is then etched through the openings and removed down to the surface of the magnetic material 22. The photoresist 36 is removed for facilitating subsequent processing.

Depending upon the type of sol-gel utilized in fabricating the monolithic integrated magnetic circuit of the invention, the openings 38 and 40 may be required to be filled with a technique different than spinning. Also, the viscosity of the sol-gel magnetic material may need to be adjusted so that the openings 38 and 40 are completely filled and in electrical contact with the underlying magnetic material 22. In accordance with conventional semiconductor lithographic techniques, opening 38 and 40 may be formed as small as one or two microns. Openings as large as ten microns in diameter can also be formed to increase the cross-sectional area of the magnetic material conveying the top and bottom material layers. The particle size of the powdered magnetic material should preferably be smaller than one tenth micron in order to assure that the openings 38 and 40 are completely filled and interfaced with the underlying magnetic material layer 22. In some applications, a single application of a second layer of liquid magnetic material may adequately fill the holes 38 and 40, and provide a uniform layer overlying the conductor 32. In other applications, a two step process may be required to first fill the holes and then to form an overlying layer.

Figure 7:
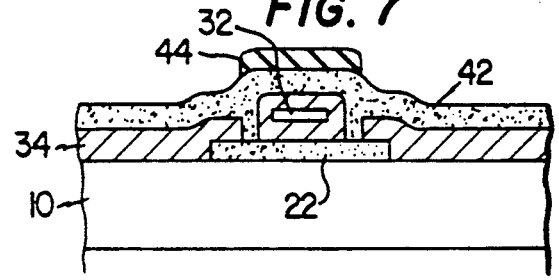

FIG. 7 illustrates a single layer 42 of liquid magnetic material covering the previously exposed portions of layers 22, 26, and 34, and filling the holes 38 and 40. The substrate is again heated to a temperature sufficient to drive the solvent from the liquid magnetic material 42, thereby leaving a solidified mass. The magnetic material 42 becomes homogeneous with that of layer 22, thereby forming an electrical magnetic circuit around the metal conductor 32. An additional photoresist layer 44 is spread over the surface of layer 42 and patterned, as shown is FIG. 7. The solidified magnetic material 42 is then etched to remove the material not underlying the photoresist mask 44. The photoresist mask 44 is removed.

Figure 8:
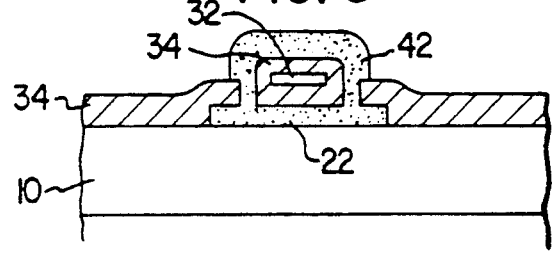

FIG. 8 illustrates the magnetic structure constructed according to the process described thus far. In practice, insulating and passivation layers would be deposited over the wafer to provide environmental and mechanical protection.

Figure 9:
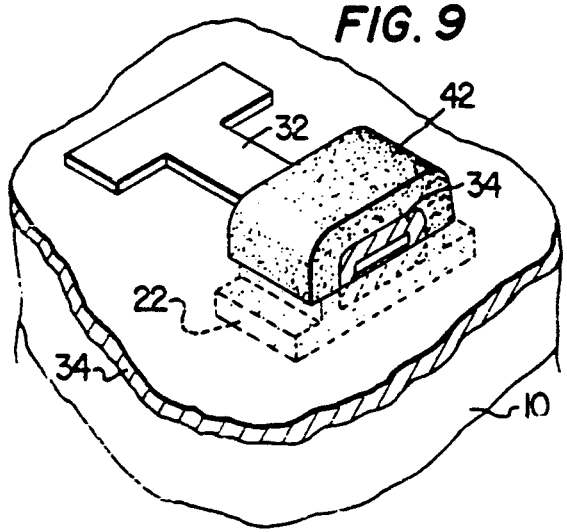
FIG. 9 is an oblique isometric view of a portion of an exemplary monolithic magnetic circuit constructed in accordance with the ivention.

FIG. 9 depicts more clearly the closed magnetic circuit, as fabricated in a silicon integrated circuit. The metallic conductor 32 passes through the closed loop of the magnetic material 42, and thus the electrical signals carried by the conductor 32 are influenced by the magnetic material 42. In order to increase the mass of magnetic material 42, the material layers can be made thicker, and such material can enclose an additional length of the conductor 32. Significantly, the magnetic material 42 can be formed with micron dimensions in accordance with conventional integrated circuit features. It is envisioned, therefore, that the application of the invention will be highly advantageous in the microwave and millimeter wavelength range where physically small electrical components are typical of the circuit elements.

Figure 10:
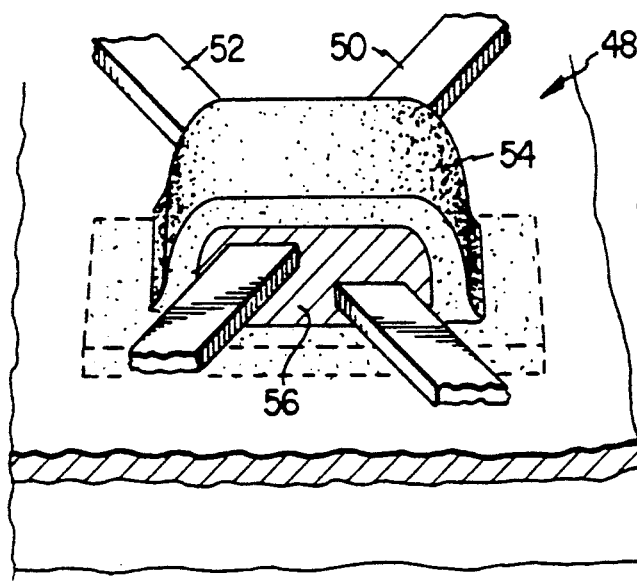
FIG. 10 is a partial sectional view of a monolithic magnetic memory cell constructed in accordance with the invention.

FIG. 10 is illustrative of another application of the invention, namely, nonvolatile magnetic memories. A magnetic memory cell 48 is shown with array conductors 50 and 52 passing through a closed magnetic circuit 54. As noted, conductor 52 is formed as a first metallization pattern, and insulated from the magnetic material 54 by an insulator 56 such as silicon oxide. The other conductor 50 is formed in a second metallization step of the integrated circuit, in a position overlying the first metallization conductor 52. The memory array conductors 50 and 52 are insulated from each other by the insulation 56. When the magnetic circuit 54 is fabricated using a conductive magnetic powder, such as a nickel alloy, electrical isolation is necessary to insulate the conductors 50 and 52 from the magnetic material 54. In the event the magnetic circuit 54 is constructed of a nonconductive magnetic powder, such as a ferroceramic, then the circuit 54 need not be insulated from the conductors 50 and 52.

A magnetic memory constructed of many cells such as shown in FIG. 10 can exhibit extremely fast access read and write cycles. In addition, the magnetic memory cells 48 are nonvolatile and are not susceptible to radiation degradation, as are memory cells of the dynamic random access type. Importantly, the Curie temperature at which the magnetic properties of the above-described circuit disappear is above that which will damage the transistor devices on the chip.

Figure 11:
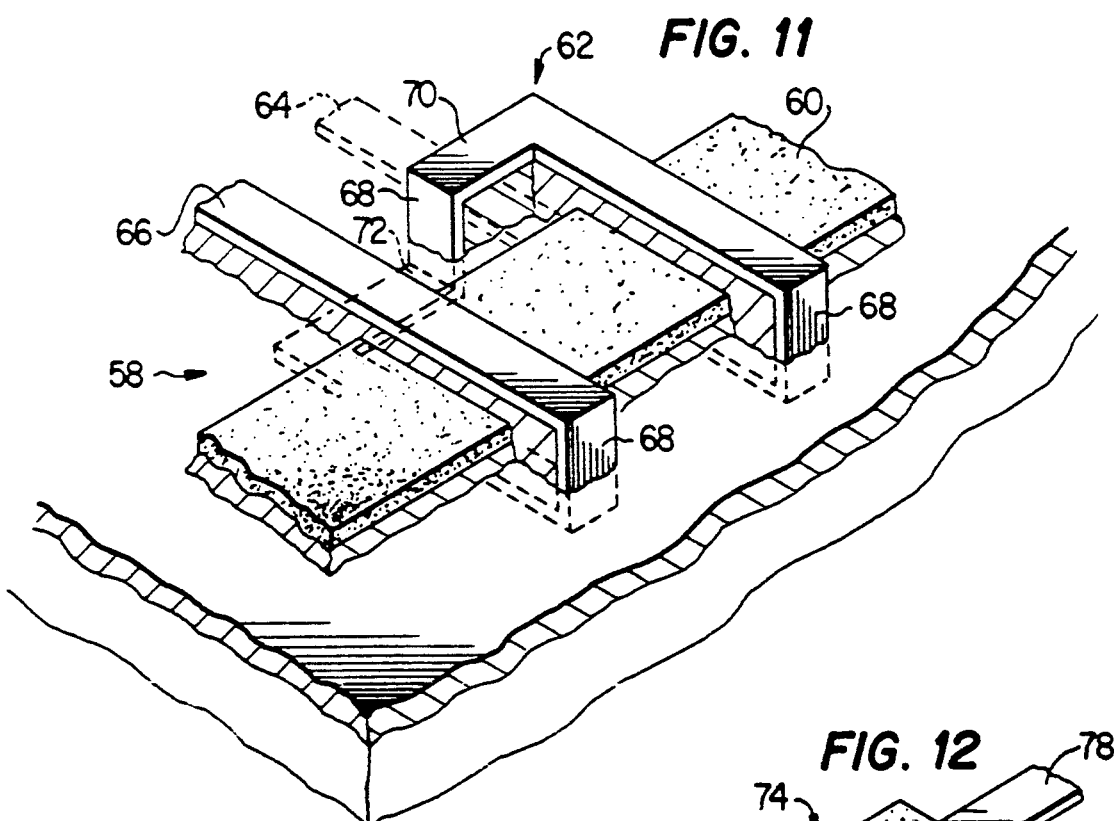
FIG. 11 is a partial sectional view of a monolithic magnetic inductor circuit of the invention.

FIG. 11 illustrates an exemplary inductor 58 constructed in accordance with the principles and concepts of the invention. A thick layer of magnetic material 60 constitutes the core of the inductor 58. A two-turn winding 62 comprising first level metallization 64, shown in broken line, and second metallization 66, provide the conductor encircling the magnetic core 60. The first level metallization 64 is connected to the second level metal 66 by vertical conductors, such as 68, at the noted locations. A lateral conductor element 70 associated with the second metal layer 66 is connected through the vertical conductor 68 to a corresponding lateral conductor 72 associated with the first metal layer 64. Again, the inductance exhibited by the inductor 58 is a function of the magnetic material comprising the core 60, and the cross-sectional area of the core. Thus, inductors of desired inductances can be constructed by changing these parameters. Also, an inductors with more windings than shown can be fabricated in a similar manner.

While not shown, a transformer can be fabricated using the structure of FIG. 11, and including an additional independent winding around the core 60. In this manner, the magnetic field generated by current flowing in the winding 62 is coupled through the magnetic core 60 and induced in the other winding. Depending upon the number of primary and secondary windings utilized, voltage step-up or step-down features can be realized.

Figure 12:
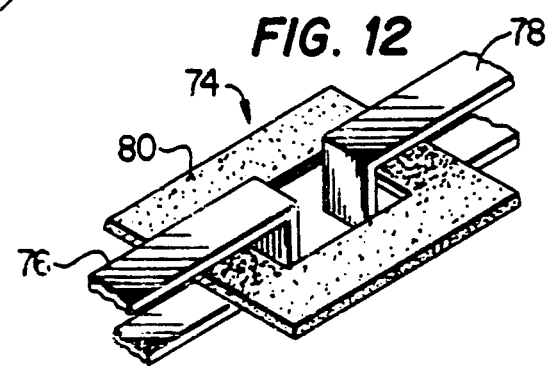
FIG. 12 is perspective view of a single turn monolithic transformer and magnetic core constructed in accordance with the invention.

FIG. 12 depicts a monolithic integrated transformer 74 having a single turn primary conductor 76, a single turn secondary conductor 78, both magnetically connected together by a planar torroidal-shaped magnetic core 80. High frequency pulse circuits can thus be DC isolated by utilizing the integrated circuit transformer 74. The magnetic core 80 can be formed with a single layer of magnetic material, and patterned using the lift-off process.

Having set forth the foregoing principles of the invention, those skilled in the art will readily appreciate that the invention is well adapted for high frequency integrated circuit operation. The integrated magnetic circuit of the invention greatly facilitates the use of inductive electrical characteristic in integrated circuits. Anticipated applications include high frequency oscillators and circulators in microwave and millimeter wave circuits, inductive logic circuits, memories, LC delay lines, and neural networks. It can also be appreciated that a deposition of the magnetic material at desired locations within an integrated circuit can provide shielding to reduce electrical interference between sections of the integrated circuit.

TECHNICAL ADVANTAGES OF THE INVENTION

From the foregoing, a monolithic integrated magnetic circuit has been disclosed. A principle advantage of the invention is that magnetic circuits can be integrated with other semiconductor circuits using conventional silicon processing techniques. Another technical advantage is that by utilizing the methods and structures of the present invention, magnetic components can be integrated in monolithic form with other semiconductor devices. Yet another technical advantage of the invention is that by making monolithic magnetic circuits possible, memory elements and switching circuits can be fabricated which are not susceptible to radiation, and which are nonvolatile in nature.

While the preferred embodiment of the invention has been disclosed with reference to specific monolithic magnetic integrated circuits, and methods of fabrication thereof, it is to be understood that many changes in detail may be made as a matter of engineering choices without departing from the spirit and scope of the invention, as defined by the appended claims.

What is claimed is:

1. A method of fabricating a monolithic magnetic circuit, comprising the steps of:
   (a) providing a semiconductor substrate;
   (b) applying an adhesive release in a desired pattern on said semiconductor substrate;
   (c) applying a liquid magnetic material to said adhesive release and exposed substrate;
   (d) curing the liquid magnetic material to form a first solidified magnetic material;
   (e) removing the magnetic material areas overlying the adhesive release;
   (f) depositing a conductor overlying the magnetic material;
   (g) applying a second liquid magnetic material over said conductor and in contact with said first solidified magnetic material disposed under said conductor; and
   (h) curing the second liquid magnetic material to form a second solidified magnetic material in contact with said first solidified magnetic material to form a closed magnetic circuit.

2. The method of claim 1 wherein said liquid magnetic material comprises sol-gel.

3. The method of claim 1 further including forming an insulating oxide over said first solidified magnetic material; and
   forming openings in said insulating oxide to said first solidified magnetic material so that the second solidified magnetic material is in contact through said openings with said underlying first solidified magnetic material.

4. The method of claim 3 further including insulating said conductor from said closed magnetic circuit using said insulating oxide.

5. The method of claim 1 further including patterning said second solidified magnetic material with a mask and removing the magnetic material not masked.

6. The method of claim 3 further including forming said openings with a diametric size of less than ten microns.

7. The method of claim 6 further including using a material with magnetic particle sizes of one micron or less to fill said openings.

8. The method of claim 6 further including filling said openings with a material having magnetic particle sizes aobut ten percent or less than the diametric size of said openings.

9. The method of fabricating a monolithic magnetic circuit, comprising the steps of:
   (a) providing a substrate;
   (b) forming a first level conductive layer of material insulated from said substrate, and patterning the conductive layer to form a conductor;
   (c) applying a magnetic material over the conductor and patterning the magnetic material to form a desired shape;
   (d) forming an electrical insulator over said conductor;
   (e) forming an opening in said insulating layer to said conductor;
   (f) forming a second level conductive layer of material over said magnetic material and through said openings in contact with said first level conductor; and
   (g) patterning said second level conductor to define a winding around said magnetic circuit so that an electrical current in said conductor is influenced by said magnetic material.

10. The method of claim 9 further including insulating said magnetic material from said first level conductor and said second level conductor.

* * * * *